(12) United States Patent
Huang (10) Patent No.: US 10,083,914 B2
(45) Date of Patent: Sep. 25, 2018

(54) INVISIBLE DUMMY FEATURES AND METHOD FOR FORMING THE SAME

(71) Applicant: TAIWAN SEMICONDUCTOR MANUFACTURING COMPANY, LTD., Hsin-Chu (TW)

(72) Inventor: Wei-Chieh Huang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/336,920

(22) Filed: Oct. 28, 2016

(65) Prior Publication Data

US 2017/0047291 A1 Feb. 16, 2017

Related U.S. Application Data (60) Continuation of application No. 14/937,954, filed on Nov. 11, 2015, now Pat. No. 9,484,310, which is a division of application No. 13/796,596, filed on Mar. 12, 2013, now Pat. No. 9,207,545.

(51) Int. Cl.
*H01L 23/544* (2006.01)
*G03F 7/20* (2006.01)
*H01L 21/768* (2006.01)

(52) U.S. Cl.
CPC ........ *H01L 23/544* (2013.01); *G03F 7/70633* (2013.01); *H01L 21/7684* (2013.01); *H01L 21/76816* (2013.01); *H01L 21/76883* (2013.01); *H01L 2223/54426* (2013.01); *H01L 2924/0002* (2013.01)

(58) Field of Classification Search
CPC ............... H01L 23/544; H01L 27/3223; H01L 21/76816; H01L 21/7684; H01L 21/76883; G03F 7/70633

USPC .......................... 257/797, E23.179, E21.244
See application file for complete search history.

(56) References Cited

U.S. PATENT DOCUMENTS

| | | | |
|---|---|---|---|
| 6,531,374 | B2 | 3/2003 | Lee et al. |
| 7,598,155 | B1 | 10/2009 | Chen et al. |
| 7,879,627 | B2 | 2/2011 | Ghinovker et al. |
| 7,952,213 | B2 | 5/2011 | Yang et al. |
| 8,022,560 | B2 | 9/2011 | Chen et al. |
| 8,513,821 | B2 | 8/2013 | Yao et al. |
| 8,703,403 | B2 | 4/2014 | Huang et al. |
| 2004/0033689 | A1 | 2/2004 | Ho et al. |
| 2005/0097764 | A1 | 5/2005 | Kim |
| 2007/0194466 | A1 | 8/2007 | Yamaguchi |

(Continued)

FOREIGN PATENT DOCUMENTS

CN 1783494 6/2006

OTHER PUBLICATIONS

Chinese Patent Office, Office Action dated Jul. 31, 2012, Application No. 201010624051.3, 6 pages.

(Continued)

*Primary Examiner* — Thien F Tran
(74) *Attorney, Agent, or Firm* — Haynes and Boone, LLP (57) ABSTRACT

An overlay mark is formed over a substrate. A plurality of first dummy features is formed outside the overlay mark in a top view. A plurality of second dummy features is formed closer to the overlay mark than the first dummy features in a top view. The first dummy features are sufficiently big to be visible to an optical machine used to scan the overlay mark. The second dummy features are sufficiently small to be invisible to the optical machine.

20 Claims, 5 Drawing Sheets

(56) References Cited

U.S. PATENT DOCUMENTS

2011/0285036 A1 11/2011 Yao et al.
2012/0038021 A1 2/2012 Chen et al.

OTHER PUBLICATIONS

Chinese Patent Office, Office Action dated Apr. 28, 2016, Application No. 201310300949.9, 10 pages.

INVISIBLE DUMMY FEATURES AND METHOD FOR FORMING THE SAME

PRIORITY DATA

The present application is a continuation application of U.S. patent application Ser. No. 14/937,954, filed on Nov. 11, 2015, which is a divisional application of U.S. patent application Ser. No. 13/796,596, filed on Mar. 12, 2013, now U.S. Pat. No. 9,207,545 issued Dec. 8, 2015, the disclosure of which is hereby incorporated by reference in its entirety.

TECHNICAL FIELD

The present disclosure relates generally to semiconductor devices, and more particularly, to an improved alignment mechanism and the fabrication thereof.

BACKGROUND

The semiconductor integrated circuit (IC) industry has experienced rapid growth. Technological advances in IC materials and design have produced generations of ICs where each generation has smaller feature sizes and more complex circuits than those from the previous generation. Such IC devices are fabricated by patterning a sequence of patterned and un-patterned layers, and the features on successive patterned layers are spatially related to each other. During fabrication, each patterned layer must be aligned with the previous patterned layers with a degree of precision. Pattern alignment techniques typically provide an overlay mark as an alignment structure to achieve alignment between successive layers.

During wafer planarization (such as a polishing process), an overlay mark pattern may be susceptible to damage caused by mechanical polishing that arises due to wafer film thickness deviations. In situations where the polishing process needs extra rework (to meet the desired thickness target), the potential damage caused to the overlay mark may be even greater. Also, if the overlay mark pattern is asymmetrical due to factors such as film uniformity control and mechanical polishing loading effect, relatively large measurement errors may be induced as well.

Therefore, although existing alignment structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
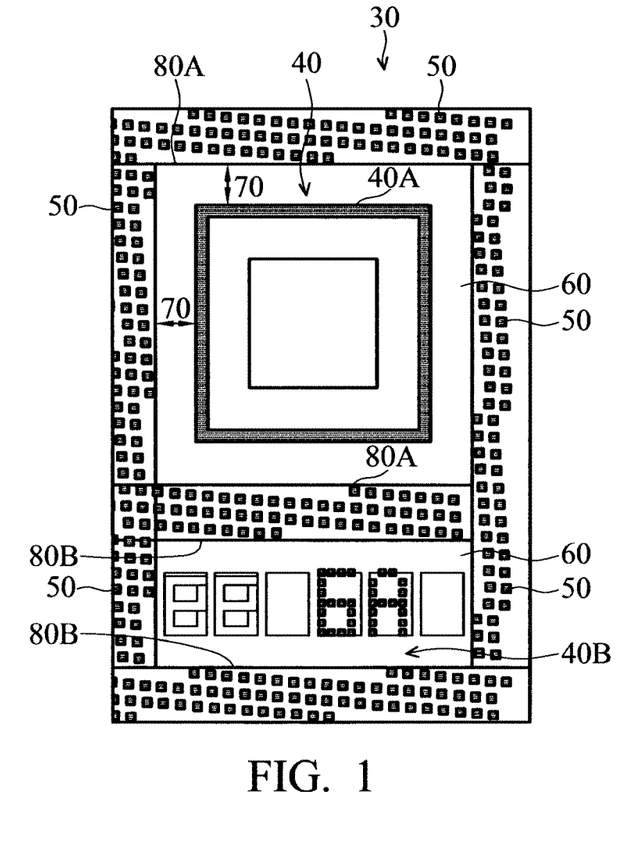
FIG. 1 is a simplified diagrammatic top view of an overlay mark.

FIG. 1 is a diagrammatic fragmentary top view of a portion of a wafer 30 that includes an overlay mark 40. The wafer 30 may also be referred to as a substrate. The overlay mark 40 includes a box-shaped element 40A. The overlay mark 40 also includes a plurality of alphanumeric digits 40B, which may be located below the box-shaped element 40A. A plurality of dummy features 50 are dispersed around the overlay mark (around both the box-shaped element 40A as well as the alphanumeric digits 40B). These dummy features are provided to alleviate a loading effect in a polishing process, such as a chemical-mechanical-polishing (CMP) process. In more detail, if the regions of the wafer 30 surrounding the overlay mark 40 is devoid of any other semiconductor patterns or features, then the polishing process will not grind away materials in an even or uniform manner. Consequently, the wafer 30 may exhibit thickness variations after the polishing process is performed, which may adversely affect the function of the overlay mark 40. The dummy features 50 are formed herein to promote pattern density uniformity around the overlay mark 40, thereby alleviating the adverse effects associated with the dishing effect.

However, in order minimize interference to the optical overlay measurement, traditionally a pattern clear area 60 is reserved in portions of the wafer 30 nearby the overlay mark 40. In other words, a minimum distance 70 is kept between the box-shaped element 40A and its closest dummy features 50, and the same is true for the alphanumeric digits 40B and its closest dummy features 50. As such, boundaries 80A and 80B are effectively formed around the box-shaped element 40A and the alphanumeric digits 40B of the overlay mark.

However, since this pattern clear area 60 (outlined by the overlay mark 40 and the boundaries 80A-80B) is devoid of any dummy features, it may still lead to micro-loading effects. For example, due to micro-loading effects, the overlay mark 40 may suffer from asymmetrical boundary or topography, which may cause image blurs in measurement. These issues are even more pronounced as device sizes continue to shrink.

To address these issues associated with the micro-loading effect, the present disclosures involves placing around the overlay mark dummy features that are "invisible" to an optical machine used to scan or detect the overlay mark. The various aspects of the present disclosure are explained in more detail below with reference to FIGS. 2-5. It is understood that FIGS. 2-5 have been simplified for the sake of clarity to better understand the inventive concepts of the present disclosure. Additional features can be added or removed, and some of the features described below can be replaced or eliminated for additional embodiments of the present disclosure.

Figure 2:
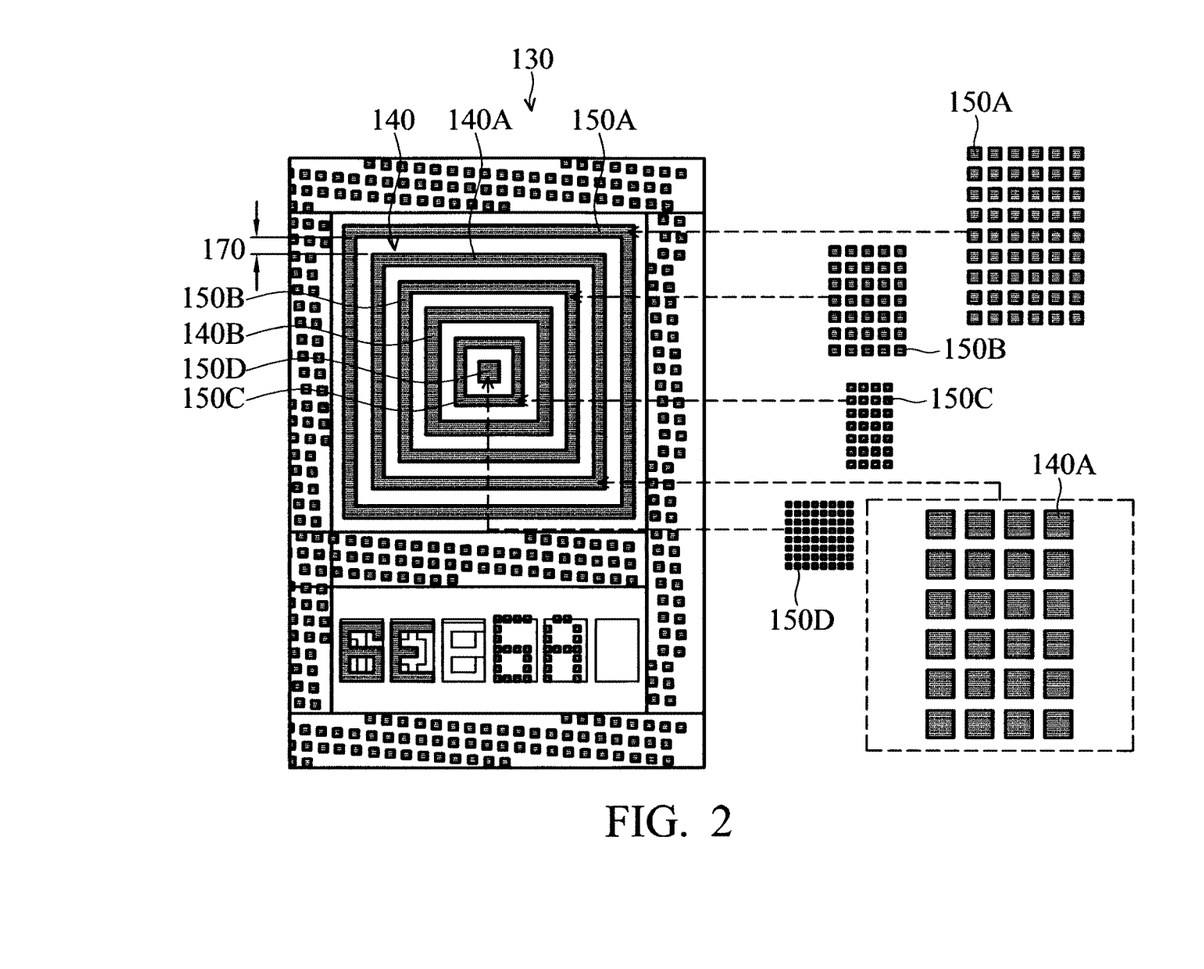
FIG. 2 is a simplified diagrammatic top view of an overlay mark according to various aspects of the present disclosure.

FIG. 2 is a diagrammatic fragmentary top view of a portion of a wafer 130 that includes an overlay mark 140. The overlay mark 140 is formed over a substrate of the wafer 130, which may be a semiconductor substrate, such as a silicon substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In other embodiments, the substrate may include a semiconductor on insulator (SOI) structure. In further embodiments, the substrate may include a doped epi layer, a gradient semiconductor layer, and/or a semiconductor layer overlying another semiconductor layer of a different type, such as a silicon layer on a silicon germanium layer.

In the illustrated embodiment, the overlay mark 140 includes a box-in-box (BIB) pattern, where a pair of concentric alignment features is formed on successive layers of an integrated circuit device. In more detail, the overlay mark 140 includes an outer box component 140A and an inner box component 140B (the alphanumeric digit portion of the overlay mark will be omitted from the discussions below for the sake of simplicity). The outer box component 140A and the inner box component 140B may each be made up of a plurality of miniature components. To provide an illustrative example of these miniature components, a "zoomed-in" top view of a section of the outer box component 140A is shown at the right side of FIG. 2. In the example shown in FIG. 2, the miniature components of the outer box component 140A appear as having miniature rectangular or square shapes in the top view. And while not specifically shown for reasons of simplicity, the same may be true for the inner box component 140B, though its miniature components may be shaped or sized differently from the outer box component 140A.

The outer box component 140A may be formed in a first material layer over the substrate, and the inner box component 140B may be formed in a second material layer over the first material layer. In other words, the inner box component 140B is located in a higher layer (in a cross-sectional view) than the outer box component 140A. In the top view of FIG. 2, however, the inner box component 140B is shown as being surrounded or encircled by the outer box component 140A.

It is understood that while the overlay mark 140 is shown as boxes in the embodiment of FIG. 2, it may be designed to include shapes other than boxes in other embodiments, including triangles, rectangles, circles, T-shapes, L-shapes, pluses, crosses, octagons, other suitable shapes, or combinations thereof.

To ensure proper alignment between the first material layer and the second material layer, a pattern recognition technique may be used. As part of the pattern recognition technique, the outer box component 140A is exposed to radiation by a suitable generator known in the art. The radiation includes visible, invisible, fluorescent, and/or polarized (which may include a single mode or multiple mode) radiation. For example, the generator can include an invisible electromagnetic wave generator, which generates a variety of invisible electromagnetic waves, including X-ray, ultraviolet (UV), and/or deep ultraviolet (DUV) waves. It is further contemplated that the radiation may possess a single wavelength or multiple wavelengths.

Reflective beams from the outer box component 140A are then detected by a detector, which may include a wavelength dispersive spectrometer, an energy dispersive spectrometer, and/or other detectors. When the reflective beams are detected by the detector, the location of the outer box component 140A may be identified. As a result, the inner box component 140B formed in the subsequently formed second material layer over the first material layer (in which the outer box component 140A is formed) may be properly positioned. The more the inner box component 140B is located near the middle of the outer box component 140A, the better the alignment between the first and second material layers.

As discussed above with reference to FIG. 1, a "pattern clear area"—area devoid of dummy features—would have been reserved around the overlay mark 140 in conventional devices. However, such "pattern clear area" will lead to micro-loading effects and may cause image blur. Thus, according to the various aspects of the present disclosure, a plurality of dummy features 150A, 150B, 150C, 150D (thereafter may be collectively referred to as dummy features 150) are formed around and nearby the overlay mark 140, even in areas that would have been deemed a "pattern clear area" in conventional devices.

For example, a subset of dummy features 150A is formed to surround the outer box component 140A of the overlay mark. The dummy features 150A include a plurality of miniature dummy elements. A "zoomed-in" top view of a segment of the subset of the dummy features 150A are shown at the right side of FIG. 2, which illustrates the arrangement and configuration of these miniature dummy elements in greater detail. These miniature dummy elements are small enough so that they appear invisible to the alignment detection tool discussed above (used to scan the overlay mark 140). In other words, the dimensions of the miniature dummy elements are below the resolution or a minimum threshold detectable by the alignment detection tool, which means that they cannot be recognized by the alignment detection tool. In some embodiments, the dimension of the miniature dummy elements is less than 0.085 micron in any direction. It may also be said that the miniature dummy elements each have an area less than about 0.085 microns×0.085 microns.

For example, the resolution of the alignment detection tool may be X nanometers (nm). Thus, the dimensions of the miniature components are less than X nm so as to avoid detection by the alignment detection tool. Consequently, despite their close proximity to the overlay mark 140, these "sub-resolution" miniature dummy elements do not cause interference or noise to the overlay mark measurement, which was the main reason why dummy features were not employed near the overlay mark in conventional devices. The miniature dummy elements also reduce the micro-loading effect discussed above, as their presence enhances the pattern density uniformity near the overlay mark.

In the illustrated embodiment, the miniature dummy elements are configured to each have a substantially similar shape (in a top view) as the miniature components of the overlay mark 140. Stated differently, since the miniature components of the overlay mark 140 have substantially rectangular shapes, the miniature dummy elements of the dummy features 150A also have substantially rectangular shapes. By having these similar shapes, lithography performance may be improved, and the micro-loading effects may be further minimized.

In addition, the dummy features 150A are configured to collectively assume a similar top view profile as the overlay mark 140. In the illustrated embodiment, the outer box component 140A and the inner box component 140B each have a box-like top view profile. As such, the dummy features 150A collectively also take on a box-like top view profile. By having these similar collectively top view profiles, the micro-loading effects may be further minimized, and the overlay mark pattern image contrast may be more sharp and uniform.

The dummy features 150 also include a subset of dummy features 150B disposed between the outer box component 140A and the inner box component 140B. The dummy features 150B surround the inner box component 140B but are surrounded by the outer box component 140A of the overlay mark. The dummy features 150B also include a plurality of miniature dummy elements, each of which is also sufficiently small to avoid detection by the alignment detection tool discussed above. Thus, these "sub-resolution" dummy elements of the dummy features 150B are also capable of reducing the micro-loading effect. Furthermore, the miniature dummy elements are also configured to have similar top view shapes (i.e., rectangular shapes) as the miniature components of the overlay mark 140, and they collectively assume a similar top view profile (i.e., box-like profile) as the overlay mark 140 as well.

The dummy features 150 also include a subset of dummy features 150C within the inner box component 140B of the overlay mark. The dummy features 150C also include a plurality of miniature dummy elements, each of which is also sufficiently small to avoid detection by the alignment detection tool discussed above. Thus, these "sub-resolution" dummy elements of the dummy features 150C are also capable of reducing the micro-loading effect. Furthermore, the miniature dummy elements are also configured to have similar top view shapes (i.e., rectangular shapes) as the miniature components of the overlay mark 140, and they collectively assume a similar top view profile (i.e., box-like profile) as the overlay mark 140 as well.

The dummy features 150 further include a subset of dummy features 150D disposed inside the inner box component 140B and further within the dummy features 150C. The dummy features 150D also include a plurality of miniature dummy elements, each of which is also sufficiently small to avoid detection by the alignment detection tool discussed above. Thus, these "sub-resolution" dummy elements of the dummy features 150D are also capable of reducing the micro-loading effect. Furthermore, the miniature dummy elements are also configured to have similar top view shapes (i.e., rectangular shapes) as the miniature components of the overlay mark 140, and they collectively assume a similar top view profile (i.e., box-like profile) as the overlay mark 140 as well.

It is understood that although the dummy features 150A-150D all include miniature dummy elements that are sufficiently small to as to appear invisible to the alignment detection tool, the sizes of these miniature dummy elements need not be uniform. For example, in the illustrated embodiment, the dimensions of the dummy elements of the dummy features 150A>dimensions of the dummy elements of the dummy features 150B>dimensions of the dummy elements of the dummy features 150C>dimensions of the dummy elements of the dummy features 150D. The smallest dummy elements among these may have dimensions that are about the same as the critical dimension (CD) of a lithography process. Alternative dimensional configurations are also possible. In other words, the dimensions of the dummy elements may be a function of its location (or dependent on its location), particularly with respect to the overlay mark 140. The dimensions of the miniature dummy elements may decrease as they get closer to the overlay mark 140, for example. This type of configuration also helps reduce the micro-loading effects discussed above.

In some embodiments (such as the illustrated embodiment), the dummy features 150 are also disposed around the overlay mark 140 in a substantially symmetrical manner. Take the subset of dummy features 150A for example, the number of its miniature dummy elements disposed on the left side of the overlay mark 140 is approximately the same as the number of its miniature dummy elements disposed on the right side of the overlay mark 140. The spacing is also approximately the same for the miniature dummy elements disposed on the left and right of the overlay mark 140. In addition, the number of its miniature dummy elements disposed on the top side of the overlay mark 140 is approximately the same as the number of its miniature dummy elements disposed on the bottom side of the overlay mark 140. The spacing is also approximately the same for the miniature dummy elements disposed above and below the overlay mark 140. The symmetrical configuration of the dummy features 150 also helps alleviate micro-loading related effects.

It is understood that though the dummy features 150 can be located in very close proximity to the overlay mark 140, a minimum distance 170 still separates the overlay mark 140 and its closest dummy features. This minimum distance may be a function of (or correlated to) a semiconductor fabrication technology generation or node under which the overlay mark 140 is formed. For example, in the illustrated embodiment, the minimum distance 170 between the overlay mark 140 and the nearest dummy features is substantially equal to a minimum pitch achievable under the semiconductor technology generation.

It is also understood that the dummy features 150 may be configured to be either rectangular or square shaped (as the ones shown in FIG. 2), or be line/space shaped. This may be dependent on the main pattern type of the layer in which the dummy features 150 are formed. If the main patterns are contact holes in the layer in which the dummy features 150 are formed, the dummy features 150 take on the rectangular or square shapes. However, if the main patterns are polysilicon gate lines, for example, then the dummy features 150 may take on a line/space shape as well.

Figure 3:
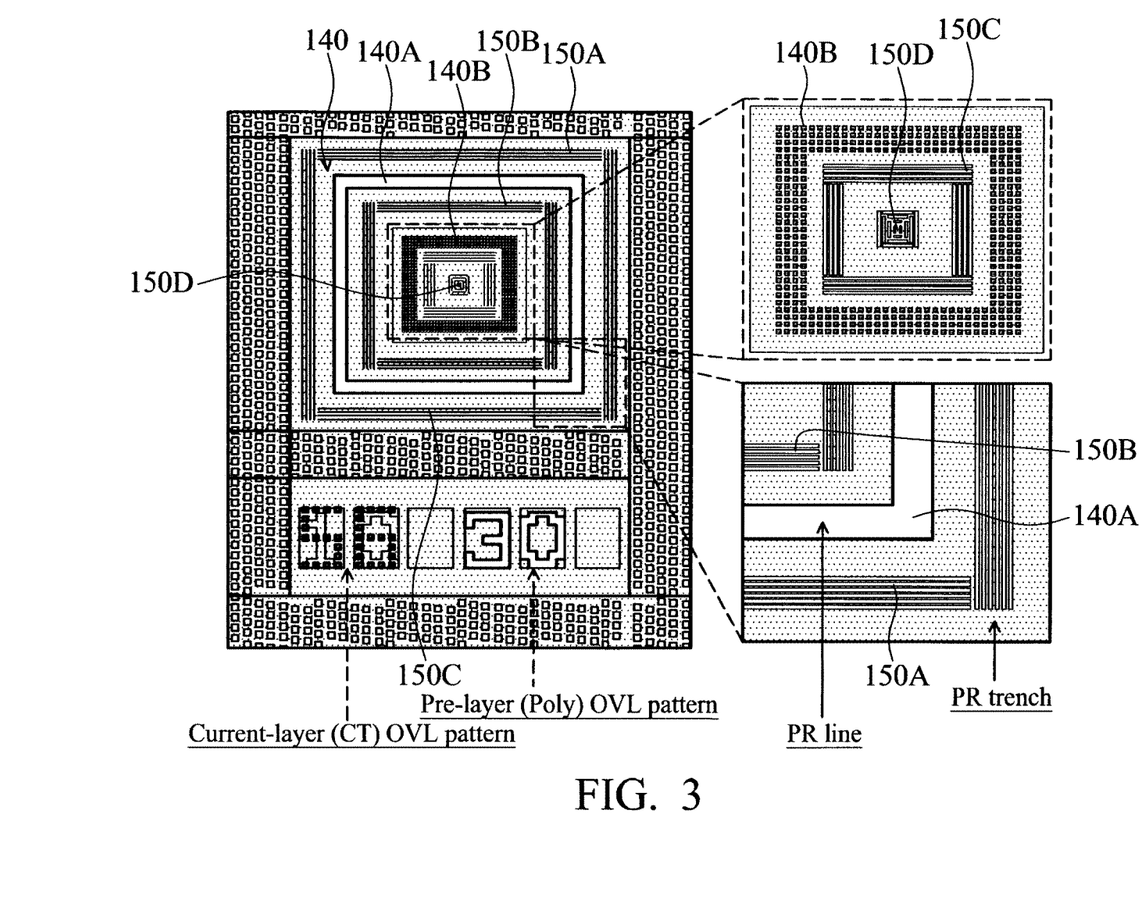
FIG. 3 is a simplified diagrammatic top view of an alternative embodiment of an overlay mark according to various aspects of the present disclosure.

This is illustrated in FIG. 3, which is a simplified diagrammatic top view of another embodiment of the overlay mark 140. In this embodiment, the outer box component 140A of the overlay mark is formed in a polysilicon layer and therefore has line-like miniature components. On the other hand, the inner box component 140B of the overlay mark is formed in a contact hole layer and therefore has rectangular or square-shaped miniature components. The dummy features 150 are also formed in the polysilicon layer (i.e., the same layer as the outer box component 140). Thus, the dummy features 150 also have miniature elements that are substantially line-shaped, similar to the miniature components of the outer box component 140A. Again, the similar shapes between the dummy features 150 and the overlay mark 140 alleviates micro-loading effects.

FIGS. 4A-4D are a series of simplified diagrammatic fragmentary cross-sectional side views of a portion of a portion of a portion of a wafer 200 that helps illustrate the improvement offered by the dummy features discussed above. For reasons of consistency and clarity, similar features in FIGS. 2-4 are labeled the same.

Figure 4A:
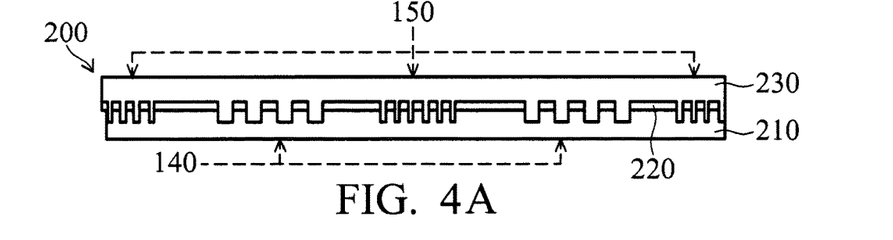
FIGS. 4A-4D are simplified diagrammatic cross-sectional side views of a portion of a wafer according to various aspects of the present disclosure.

Referring to FIG. 4A, the portion of the wafer 200 includes a material layer 210, which may be disposed over a substrate. In some embodiments, the material layer 210 is a dielectric layer and may include an oxide material. A material layer 220 is disposed over the material layer 210. In some embodiments, the material layer 220 is another dielectric layer and may include a nitride material. Of course, other suitable materials may be used for the material layers 210-220 in different embodiments.

Through a lithography process, openings or trenches are etched into the material layers 220 and 210. A deposition process is then performed to fill these openings with a conductive material 230, for example a metal such as copper. At this point, the overlay mark 140 and the sub-resolution dummy features 150 are formed. The overlay mark 140 includes the conductive material 230 filling openings that are large enough to be detected by an alignment detection tool, whereas the dummy features 150 include conductive material 230 filling openings that are small enough to appear invisible to the alignment detection tool.

Figure 4B:
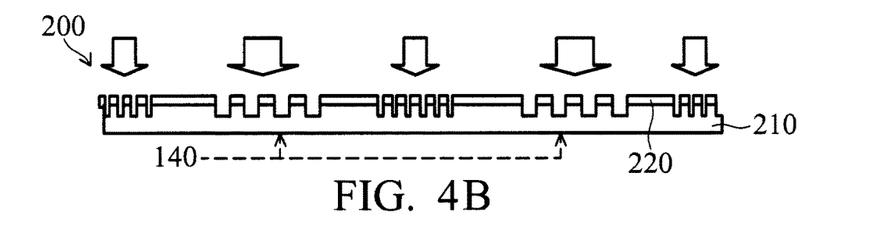

Referring now to FIG. 4B, a first polishing process is performed to the portion of the wafer 200. The first polishing process may include a chemical mechanical polishing (CMP) process in some embodiments. The material layer 220 serves as a polishing-stop layer, thus the first polishing process stops at the material layer 220.

Figure 4C:
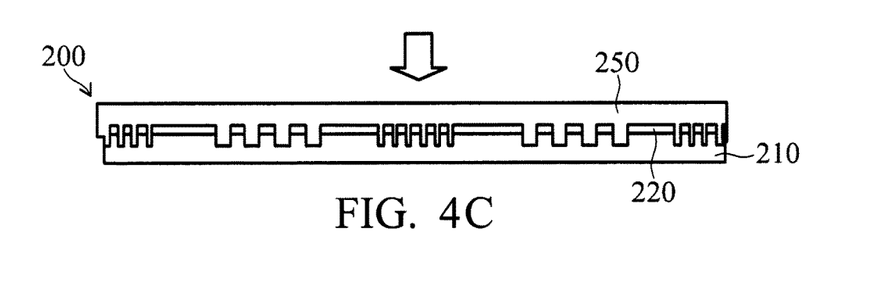

Referring now to FIG. 4C, a deposition process is performed to form a conductive material 250 over the material layer 220 and over the portions of the conductive material 230 remaining in the openings (i.e., the overlay mark 140 and the dummy features 150). In some embodiments, the conductive material 250 includes a metal, such as tantalum nitride.

Figure 4D:
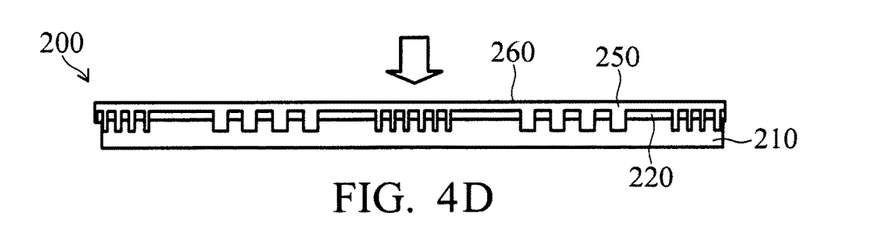

Referring now to FIG. 4D, a second polishing process is performed to the wafer 200. The second polishing process may include a chemical mechanical polishing (CMP) process in some embodiments. There are no polishing-stop layers for the second polishing process.

It can be seen that after the second polishing process is performed, the polished conductive material 250 has a relatively flat surface 260. Stated differently, the post-polishing topography variation is minimal and relatively uniform for the portion of the wafer 200. This is largely due to the deployment of the dummy features 150, which enhance the pattern density uniform for the portion of the wafer 200, and yet at the same time cause no interference for the detection of the overlay mark 200 due to their (i.e., the dummy features) sub-resolution dimensions.

Figure 5:
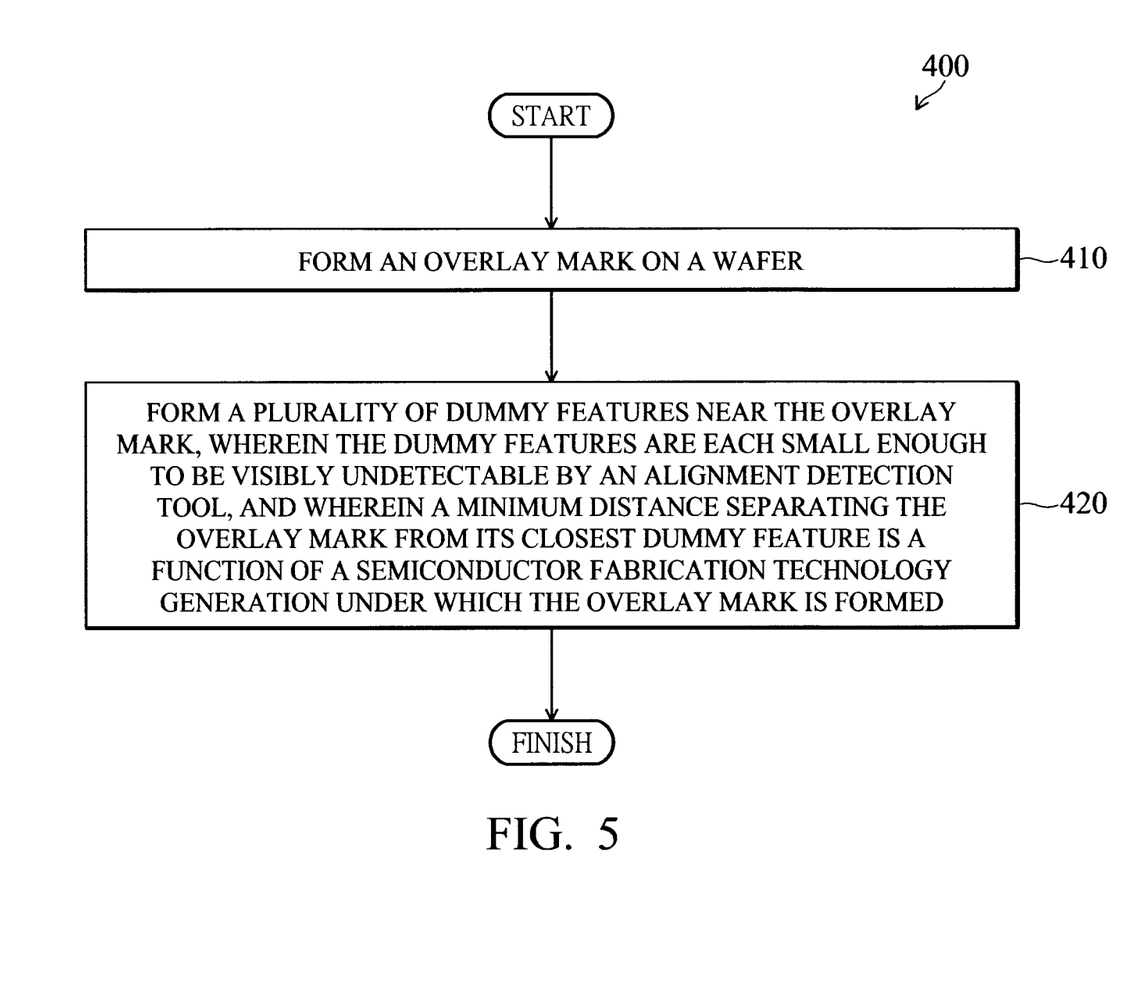
FIG. 5 is a flowchart of a method for fabricating an integrated circuit device according to various aspects of the present disclosure.

FIG. 5 is a flowchart of a method 400 for fabricating an integrated circuit device. The method 400 includes a step 410, in which an overlay mark is formed on a wafer. In some embodiments, the overlay mark includes a box-in-box arrangement. For example, the overlay mark includes an inner box and an outer box surrounding the inner box.

The method 400 includes a step 420, in which a plurality of dummy features is formed nearby the overlay mark. It is understood, however, that the dummy features may be formed at the same time as the overlay mark, and that the steps 410 and 420 need not be sequentially performed. In other words, the steps 410 and 420 may be simultaneously performed (or are parts of the same step). The dummy features are each small enough to be visibly undetectable by an alignment detection tool. The alignment detection tool may be a machine configured to optically scan the overlay mark in an alignment process. A minimum distance separating the overlay mark from its closest dummy feature is a function of (or is correlated to) a semiconductor fabrication technology generation under which the overlay mark is formed. In some embodiments, the minimum distance is substantially equal to a minimum pitch achievable under the semiconductor fabrication technology generation.

In some embodiments, the dummy features are disposed around the overlay mark in a substantially symmetrical manner. In some embodiments, a size of each dummy feature is a function of (or is correlated to) its distance from the overlay mark. In some embodiments, the sizes of the dummy features decrease as the dummy features get closer to the overlay mark. In some embodiments, a first subset of the dummy features is surrounded by the inner box, a second subset of the dummy features is outside the inner box but surrounded by the outer box, and a third subset of the dummy features is outside the outer box and surrounds the outer box. In some embodiments, the overlay mark includes a plurality of miniature elements, and at least some of the dummy features each have a shape in a top view that resembles one of the miniature elements. In some embodiments, at least a portion of the overlay mark has a predefined top view profile, and at least some of the dummy features collectively form a top view profile that resembles the top view profile of the portion of the overlay mark.

Many variations of the above example are contemplated by the present disclosure. For example, as noted above, the disclosed examples have been simplified for the sake of clarity to better understand the inventive concepts of the present disclosure. Any combination of dimensions, pitches, shapes, number of patterns, or area of patterns is contemplated for the sub-resolution dummy features. In some examples, a dummy feature may be divided into multiple dummy features. In some examples, the overlay marks (for example, the outer boxes) are divided into multiple material features to form the overlay marks. Any combination of the examples described herein is contemplated.

One aspect of the present disclosure involves an apparatus. The apparatus includes: an overlay mark formed on a substrate; and a plurality of dummy features formed nearby the overlay mark; wherein: a dimension of each of the dummy features is below a minimum threshold detectable by an alignment detection tool; and a minimum distance separating the overlay mark from its closest dummy feature is correlated to a minimum pitch achievable by a semiconductor fabrication technology generation under which the overlay mark is formed.

In some embodiments, the dummy features are composed of numerous dummy elements that are each smaller than about 0.085 microns.

In some embodiments, the dummy features are disposed around the overlay mark in a substantially symmetrical manner.

In some embodiments, a size of each dummy feature is correlated to its distance from the overlay mark.

In some embodiments, the sizes of the dummy features decrease as the dummy features get closer to the overlay mark.

In some embodiments, the overlay mark includes an inner box and an outer box surrounding the inner box; a first subset of the dummy features is surrounded by the inner box; a second subset of the dummy features is outside the inner box but surrounded by the outer box; and a third subset of the dummy features is outside the outer box and surrounds the outer box.

In some embodiments, the overlay mark includes a plurality of miniature elements; and at least some of the dummy features each have a shape in a top view that resembles one of the miniature elements.

In some embodiments, at least a portion of the overlay mark has a predefined top view profile; and at least some of the dummy features collectively form a top view profile that resembles the top view profile of the portion of the overlay mark.

In some embodiments, the alignment detection tool is configured to optically scan the overlay mark in an alignment process.

Another aspect of the present disclosure involves an alignment mechanism in semiconductor fabrication. The alignment mechanism includes: an overlay mark disposed on a substrate, the overlay mark including a plurality of sub-components; and a plurality of dummy features disposed in proximity to the overlay mark; wherein: the dummy features have dimensions below a resolution of an overlay mark detector used to detect the overlay mark; a minimum spacing between the overlay mark and the dummy features is approximately equal to a minimum pitch achievable under a semiconductor fabrication technology node; and at least some of the dummy features have top view shapes similar to the sub-components of the overlay mark; and at least a subset of the dummy features assumes a collective top view profile similar to the overlay mark.

In some embodiments, the minimum spacing is substantially equal to the finest pitch.

In some embodiments, the dummy features are disposed substantially symmetrically about the overlay mark.

In some embodiments, the dimensions of the dummy features vary as a function of locations of the dummy features with respect to the overlay mark.

In some embodiments, the overlay mark includes a first box disposed within a second box; and the dummy features are disposed within the first box, between the first box and the second box, and outside the second box.

One aspect of the present disclosure involves a method of fabricating a semiconductor device. The method includes: forming an overlay mark on a substrate and forming a plurality of dummy features near the overlay mark; wherein: the dummy features are each below a resolution of an alignment detection tool configured to optically scan the overlay mark in an alignment process; and a minimum distance separating the overlay mark from its closest dummy feature is correlated to a minimum pitch of a semiconductor fabrication technology generation under which the overlay mark is formed.

In some embodiments, the dummy features are composed of numerous elements that are each smaller than about 0.085 microns.

In some embodiments, the dummy features are disposed around the overlay mark in a substantially symmetrical manner.

In some embodiments, a size of each dummy feature is correlated to its distance from the overlay mark.

In some embodiments, the overlay mark includes a plurality of miniature elements; and at least some of the dummy features each have a shape in a top view that resembles one of the miniature elements.

In some embodiments, at least a portion of the overlay mark has a predefined top view profile; and at least some of the dummy features collectively form a top view profile that resembles the top view profile of the portion of the overlay mark.

The foregoing outlines features of several embodiments so that those skilled in the art may better understand the aspects of the present disclosure. Features illustrated and discussed above with respect to some embodiments can be combined with features illustrated and discussed above with respect to other embodiments. Those skilled in the art should appreciate that they may readily use the present disclosure as a basis for designing or modifying other processes and structures for carrying out the same purposes and/or achieving the same advantages of the embodiments introduced herein. Accordingly, all such modifications are intended to be included within the scope of this disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   an overlay mark formed over a substrate;
   a plurality of first dummy features formed outside the overlay mark in a top view; and
   a plurality of second dummy features formed within the overlay mark in the top view;
   wherein:
   dimensions of the first dummy features are greater than dimensions of the second dummy features; and
   the second dummy features are sufficiently small to be invisible to an optical machine.

2. The device of claim 1, wherein the overlay mark includes a first portion and a second portion, the first portion being circumferentially surrounded by the second portion in the top view.

3. The device of claim 2, wherein the first portion and the second portion are formed in different layers.

4. The device of claim 3, wherein the different layers include a polysilicon layer and a contact hole layer.

5. The device of claim 2, wherein:
   the second dummy features comprise a first group, a second group, and a third group;
   the first group of the second dummy features is disposed within the second group of the second dummy features in the top view;
   the second group of the second dummy features is disposed within the first portion of the overlay mark in the top view; and
   the third group of the second dummy features is disposed between the first portion and the second portion of the overlay mark in the top view.

6. The device of claim 5, wherein the first group of the second dummy features, the second group of the second dummy features, and the third group of the second dummy features are each arranged into a shape that resembles a shape of the first portion or the second portion of the overlay mark in the top view.

7. The device of claim 5, wherein:
   the second dummy features in the first group are each smaller than the second dummy features in the second group; and
   the second dummy features in the second group are each smaller than the second dummy features in the third group.

8. The device of claim 1, wherein the second dummy features each has a square-like shape in the top view.

9. The device of claim 1, wherein the second dummy features each has a line-like shape in the top view.

10. The device of claim 1, wherein dimensions of the second dummy features decrease with a decreasing separation distance between the second dummy features and the overlay mark.

11. A device, comprising:
a first portion of an overlay mark located over a substrate;
a second portion of the overlay mark located over the substrate, the second portion encircling the first portion in a top view;
a first group of dummy features that are encircled by the first portion of the overlay mark in the top view;
a second group of dummy features that encircle the first portion of the overlay mark in the top view but are encircled by the second portion of the overlay mark in the top view; and
a third group of dummy features that encircle the second portion of the overlay mark in the top view;
wherein:
each of the dummy features in the first group is smaller than each of the dummy features in the second group; and
each of the dummy features in the second group is smaller than each of the dummy features in the third group.

12. The device of claim 11, further comprising a fourth group of dummy features that encircle: the first portion of the overlay mark, the second portion of the overlay mark, the first group of the dummy features, the second group of the dummy features, and the third group of the dummy features, wherein:
the fourth group of the dummy features are visible to an optical scanning tool; and
the first group, second group, and third group of the dummy features are each invisible to the optical scanning tool.

13. The device of claim 11, wherein in the top view:
the first portion of the overlay mark is shaped as a first box;
the second portion of the overlay mark is shaped as a second box; and
the first, the second, and the third group of the dummy features are each arranged to have a box-like profile.

14. The device of claim 11, wherein:
the first portion of the overlay mark is formed in a first layer; and
the second portion of the overlay mark is formed in a second layer different from the first layer.

15. The device of claim 14, wherein:
one of the first layer and the second layer is a polysilicon layer; and
the other of the first layer and the second layer is a contact hole layer.

16. The device of claim 11, wherein the first group of the dummy features, the second group of the dummy features, and the third group of the dummy features each comprise a plurality of elements shaped similar to a square in the top view.

17. The device of claim 11, wherein the first group of the dummy features, the second group of the dummy features, and the third group of the dummy features each comprise a plurality of elements shaped similar to an elongated rectangle in the top view.

18. A device, comprising:
an overlay mark formed over a substrate, the overlay mark including an inner box formed in a first layer and an outer box formed in a second layer different from the first layer, wherein the outer box circumferentially surrounds the inner box in a top view;
a first group of dummy features located within the inner box in the top view;
a second group of dummy features located between the inner box and the outer box in the top view; and
a third group of dummy features located outside the outer box in the top view;
wherein:
the dummy features in the first group have smaller dimensions than the dummy features in the second group;
the dummy features in the second group have smaller dimensions than the dummy features in the third group; and
the dummy features in the first group, the second group, and the third group are undetectable by an optical scanning tool used to scan the overlay mark.

19. The device of claim 18, further comprising a fourth group of dummy features that defines a region in the top view;
wherein:
the overlay mark and the first, the second, and the third group of dummy features are all located within the region;
the dummy features in the fourth group have greater dimensions than the dummy features in the first, the second, and the third dummy features; and
the dummy features in the fourth group are detectable by the optical scanning tool.

20. The device of claim 18, wherein the first group, the second group, and the third group of the dummy features are arranged into a first box, a second box, and a third box in the top view.

* * * * *